(12) United States Patent
Ginart et al.

(10) Patent No.: US 11,428,750 B1
(45) Date of Patent: Aug. 30, 2022

(54) MONITORING NON-UNIFORM CAPACITOR AND IGBT DEGRADATION WITH CURRENT SENSORS

(71) Applicant: Smart Wires Inc., Union City, CA (US)

(72) Inventors: Antonio Ginart, Santa Clarita, CA (US); Shreesha Adiga Manoor, Milpitas, CA (US); Haroon Inam, San Jose, CA (US)

(73) Assignee: Smart Wires Inc., Union City, CA (US)

( * ) Notice: Subject to any disclaimer, the term of this patent is extended or adjusted under 35 U.S.C. 154(b) by 0 days.

(21) Appl. No.: 16/891,515

(22) Filed: Jun. 3, 2020

Related U.S. Application Data

(60) Provisional application No. 62/947,443, filed on Dec. 12, 2019.

(51) Int. Cl.
*G01R 31/42* (2006.01)
*G01R 31/64* (2020.01)
(Continued)

(52) U.S. Cl.
CPC ......... *G01R 31/42* (2013.01); *G01R 31/2608* (2013.01); *G01R 31/64* (2020.01); *H03K 17/567* (2013.01)

(58) Field of Classification Search
CPC ........ G01R 31/42; G01R 31/64; G01R 31/40; G01R 31/2608; G01R 31/2621; G01R 31/343; G01R 31/52; G01R 31/327; G01R 19/0092; G01R 31/389; G01R 31/3277; G01R 27/16; G01R 31/2617; G01R 31/36; G01R 19/0084; G01R 31/2607; G01R 31/3842; G01R 31/002; G01R 31/2637; G01R 31/261; G01R 31/50; G01R 31/3008; G01R 31/66; G01R 19/165; G01R 19/145; G01R 19/04; G01R 31/2879; G01R 31/3271; G01R 31/3275; G01R 31/28; G01R 31/12; G01R 31/016; G01R 27/26; H02H 7/1255; H02H 3/08; H02H 1/0007; H02H 3/044; H02H 7/1225; H02H 7/205;
(Continued)

(56) References Cited

U.S. PATENT DOCUMENTS 7,868,584 B2   1/2011  Hara et al.
8,000,930 B2   8/2011  Poncet et al.
(Continued)

FOREIGN PATENT DOCUMENTS

CN  104124876 A     10/2014
DE  102014222681 A1 *  5/2015  ......... G01R 27/2605
KR  10-0557715 B1   3/2006

*Primary Examiner* — Vinh P Nguyen
(74) *Attorney, Agent, or Firm* — Womble Bond Dickinson (US) LLP

(57) ABSTRACT

Systems and methods of detecting non-uniform aging and degradation of power assembly units are disclosed. The system may include a first power assembly unit and a second power assembly unit adjacent to the first power assembly unit. Each of the first and second power assembly units has a coupling capacitor and a number of electrical components. The system may further include a current sensor in between the coupling capacitors of the first and second power assembly units to detect a current spike in the coupling capacitors and the electrical components.

7 Claims, 3 Drawing Sheets

(51) Int. Cl.
*G01R 31/26* (2020.01)
*H03K 17/567* (2006.01)

(58) Field of Classification Search
CPC ........ H02H 3/44; H02H 7/0844; H02H 7/122;
H02H 7/1227; H02H 9/04; H02H 7/085;
H02H 7/16; H02H 9/02; G06F 3/044;
G06F 2119/04; G06F 2119/02; H01G 4/40

See application file for complete search history.

(56) References Cited

U.S. PATENT DOCUMENTS

| | | | |
|---|---|---|---|
| 8,103,463 B2 | 1/2012 | Kalgren et al. | |
| 8,698,507 B2 * | 4/2014 | Huang | G01R 31/64 |
| | | | 324/548 |
| 9,054,589 B2 * | 6/2015 | Cheng | H02M 5/4585 |
| 9,240,733 B2 * | 1/2016 | Royak | H02P 21/06 |
| 9,318,944 B2 | 4/2016 | Royak et al. | |
| 9,389,263 B2 * | 7/2016 | Sartler | G01R 27/2688 |
| 9,494,657 B2 | 11/2016 | Khan et al. | |
| 9,653,984 B2 * | 5/2017 | Patel | H02M 1/126 |
| 9,735,696 B2 * | 8/2017 | Bhandarkar | H02M 1/126 |

* cited by examiner

MONITORING NON-UNIFORM CAPACITOR AND IGBT DEGRADATION WITH CURRENT SENSORS

CROSS REFERENCE TO RELATED APPLICATIONS

This application claims the benefit of U.S. Provisional Application No. 62/947,443 filed on Dec. 12, 2019, the disclosure of which is incorporated herein by reference.

TECHNICAL FIELD

Embodiments of the present disclosure relate generally to an inverter (or power inverter) in power electronics. More particularly, embodiments of the disclosure relate to systems and methods of using built-in current sensors to detect non-uniform degradation and aging of capacitors, insulated-gate bipolar transistors (IGBTs), and supporting semiconductor components to permit proactive maintenance and condition-based reconfiguration of the inverter.

BACKGROUND

Impedance injection modules (IIMs) are also known as inverters or converters in power electronics. They are commonly implemented by full bridge quad-IGBT (insulated-gate bipolar transistor) devices. Their supporting semiconductor components and coupling capacitor are shown in FIG. 1. Generally, the supporting semiconductor components and coupling capacitor are deployed in a power grid to improve the power factor, that is, the efficiency of the power transmission and distribution.

In FIG. 1, a normal operating mode of a quad-IGBT-based full bridge inverter, which is typical of power electronics deployed in the field, is depicted. The quad-IGBTs shown in FIG. 1 are Q1, Q2, Q3, and Q4 and the coupling capacitor is C in the diagram. Herein, a coupling capacitor with the quad-IGBTs Q1-Q4 full bridge impedance injection module may be referred to as a power assembly. This power assembly is sometimes known as a wall in the automotive industry.

With continued reference to FIG. 1, during the first half of the full power cycle, current $I_{first\_half}$ flows from left to right on the load when Q1 and Q4 are turned on and Q2 and Q3 are turned off. During the second half of the cycle, current $I_{second\_half}$ flows from right to left on the load when Q2 and Q3 are turned on and Q1 and Q4 are turned off. The resulting output is an alternating current (AC) signal that alternates between positive and negative that is required by the power grid.

The common failure patterns of IIMs are the IGBTs and their supporting semiconductor components and the coupling capacitors. IGBTs and their supporting semiconductor components degrade over time, thereby resulting in increased heat losses and diminishing and varying speed of switching. High power direct current (DC) and AC capacitors are typically of the metalized film type, usually polypropylene (PP) capacitors. PP capacitors can fail or diminish in capacitance value due to temperature rise causing local melting, or delamination, particularly with high ripple component that creates a strong force between the capacitor electrodes.

Unfortunately, the failure of IIMs can lead to unexpected downtime and disruptive services of the power grid and is quite expensive to remediate.

BRIEF DESCRIPTION OF THE DRAWINGS

Embodiments of the disclosure are illustrated by way of example and not limitation in the figures of the accompanying drawings in which like references indicate similar elements.

DETAILED DESCRIPTION

Figure 1:
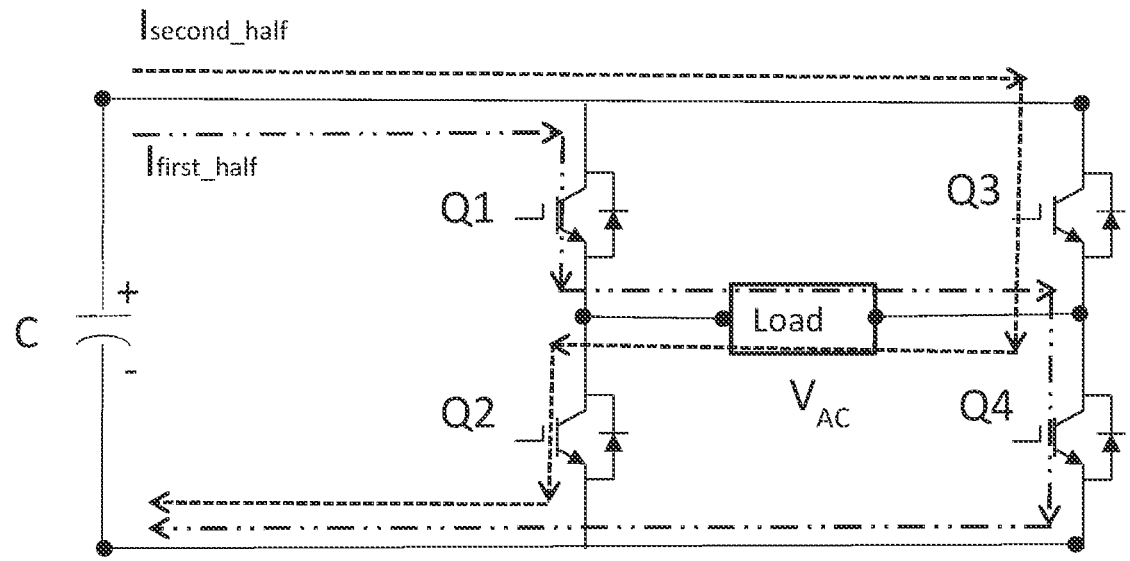
FIG. 1 is a circuit block diagram that depicts a normal operating mode of an IGBT-based full bridge inverter, known as a power assembly unit.

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

According to some embodiments, when bridge type impedance injection modules are constructed in parallel design, non-uniform aging and degradation of electrical components in the impedance injection modules can be detected through a built-in current sensor. For example, non-uniform aging of capacitors can be detected through current imbalance with the built-in current sensor going through each impedance injection module. Similarly, the non-uniform degradation of the IGBTs and their supporting semiconductor components can be detected using a current sensor between the capacitors of the two adjacent impedance injection modules. This continuous monitoring permits the quantification of the degradation. It provides guidance for proactive maintenance schedule to avoid unexpected downtime and interrupted services. It can also permit condition-based reconfiguration of the impedance injection module to support lower injection level based on, for example, the degraded capacitance value.

In one aspect, a system to detect non-uniform aging and degradation of power assembly units is described. The system may include a first power assembly unit and a second power assembly unit adjacent to the first power assembly unit. Each of the first and second power assembly units has a coupling capacitor and a number of electrical components. The system may further include a current sensor in between the coupling capacitors of the first and second power assembly units to detect a current spike in the coupling capacitors and the plurality of electrical components. The current spike may be detected when the coupling capacitor of the first power assembly unit holds more voltage than the coupling capacitor of the second power assembly unit, or vice versa. The electrical components of the first and second power assembly units may include a number of insulated-gate bipolar transistors (IGBTs) and supporting semiconductor components. The IGBTs of the first power assembly unit and the IGBTs of the second power assembly unit may operate as switches to drive a load in an alternating fashion with assistance of the coupling capacitor of the first power assembly unit and the coupling capacitor of the second power assembly unit, respectively. In one embodiment, the coupling capacitor of the first power assembly unit holds more voltage than the coupling capacitor of the second power assembly unit, or vice versa, when there is a difference in switching delays between the IGBTs of the first power assembly unit and the IGBTs of the second power assembly unit, with the IGBTs of the first power assembly unit and the IGBTs of the second power assembly unit charging their respective coupling capacitors with different timings. The current spike may be detected when the difference in switching delays exceeds a pre-established threshold value. In one embodiment, the first power assembly unit and the second power assembly unit are arranged in mirror image. In one embodiment, the first and second power assembly units are impedance injection modules.

In another aspect, a system to detect non-uniform aging and degradation of power assembly units is described. The system may include a first power assembly unit and a second power assembly unit adjacent to the first power assembly unit. Each of the first and second power assembly units has a coupling capacitor and a plurality of electrical components. The system may further include first and second line current sensors in the first and second power assembly units, respectively, to detect a difference between a first capacitance value of the coupling capacitor of the first power assembly unit and a second capacitance value of the coupling capacitor of the second power assembly unit. In one embodiment, to detect the difference between the first and second capacitance values, the first line current sensor in the first power assembly unit is used to compute the first capacitance value and the second line current sensor in the second power assembly unit used to compute the second capacitance value. In one embodiment, the difference between the first and second capacitance values is detected when there is an imbalance between respective line currents passing through the first and second line current sensors. In one embodiment, the first and second line current sensors are connected in series with a load in the system. In one embodiment, the electrical components of the first and second power assembly units include a number of insulated-gate bipolar transistors (IGBTs) and supporting semiconductor components. In one embodiment, the difference between the first and second capacitance values is caused by a temperature rise that results in local melting or delamination. In one embodiment, the first power assembly unit and the second power assembly unit are arranged in mirror image. In one embodiment, the first and second power assembly units are impedance injection modules.

In yet another aspect, a method of detecting non-uniform aging and degradation of power assembly units is described. The method may include providing a first power assembly unit and a second power assembly unit adjacent to the first power assembly unit, with each of the first and second power assembly units having a coupling capacitor and a plurality of electrical components. The method may further include providing a current sensor in between the coupling capacitors of the first and second power assembly units to detect a current spike in the coupling capacitors and the plurality of electrical components.

Figure 2:
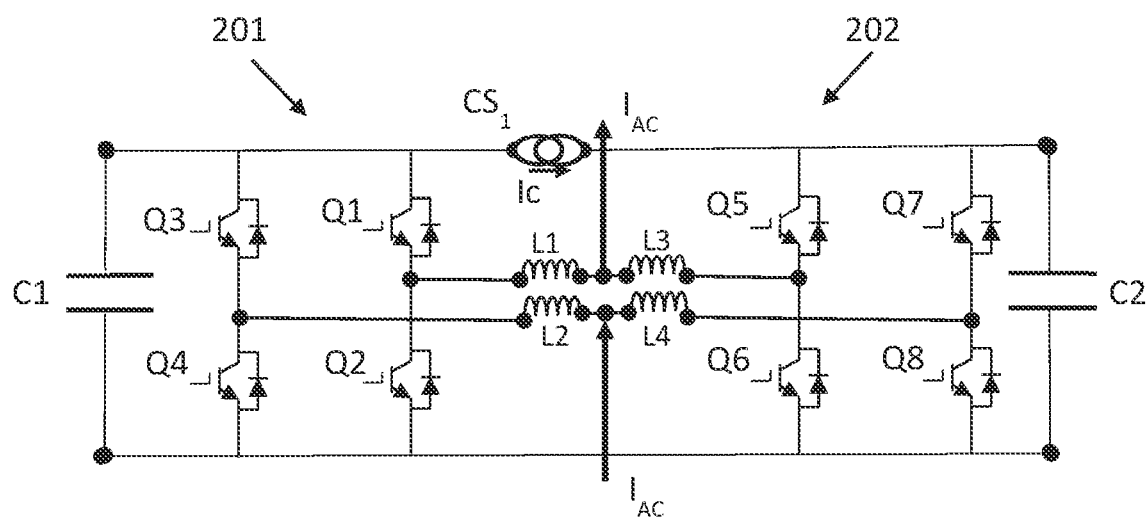
FIG. 2 shows an example inter-capacitor current sensor between two power assembly units in parallel construction design according to one embodiment.

FIG. 2 shows an example inter-capacitor current sensor between two power assembly units in parallel construction design according to one embodiment. Referring to FIG. 2, an inter-capacitor current sensor $CS_1$ is installed between respective capacitors C1 and C2 of a pair of adjacent power assembly units 201-202. The current sensor $CS_1$ may be used to detect instantaneous current flow due to imbalanced capacitor voltages. In FIG. 2, there are two power assembly units 201-202 arranged or drawn in mirror image to mimic their physical construction, though there can be more parallel power assembly units in a design, and more inter-capacitor current sensors can be added in those embodiments. Note that a current $I_{AC}$ flows out of power assembly units 201-202 to the load at the top and flows back in to the power assembly units 201-202 from the bottom.

With continued reference to FIG. 2, inter-capacitor current sensor $CS_1$ with current Ic may detect a current spike in IGBTs Q1-Q8 and their corresponding supporting semiconductor components (e.g., inductors L1-L4) between power assembly units 201-202. IGBTs Q1-Q4 of power assembly unit 201 and IGBTs Q5-Q8 of power assembly unit 202 may operate as switches to drive the load in an alternating fashion with the assistance of respective coupling capacitors C1 and C2. For example, as a switch, there may be a switching delay due to the physical movement of electrons in the midst of transistor layers. Current spikes may occur due to non-uniform aging of the IGBTs Q1-Q8. The difference in switching delays between the power assembly units 201-202 may charge the capacitors C1 and C2, respectively, with different timings. The inter-capacitor current sensor $CS_1$ can thus detect a current spike when one capacitor holds more voltage than another, for example $C_1$ may hold more voltage than C2, and vice versa. The current spike may disappear when the slower-charged capacitor finally holds the same amount of voltage as the other capacitor.

Generally, the timing delay between the power assembly units 201-202 is negligible when first deployed in the field. As non-uniform aging and degradation occur, the current spikes caused by different switching delays become detectable when the difference in switching delays exceeds a pre-established threshold value as a function of the specific design in question. In some embodiments, the pre-established threshold value may be about two microseconds, though the pre-established threshold value may vary (e.g., from nanoseconds to microseconds) depending on design parameters of the power assembly units 201-202.

Figure 3:
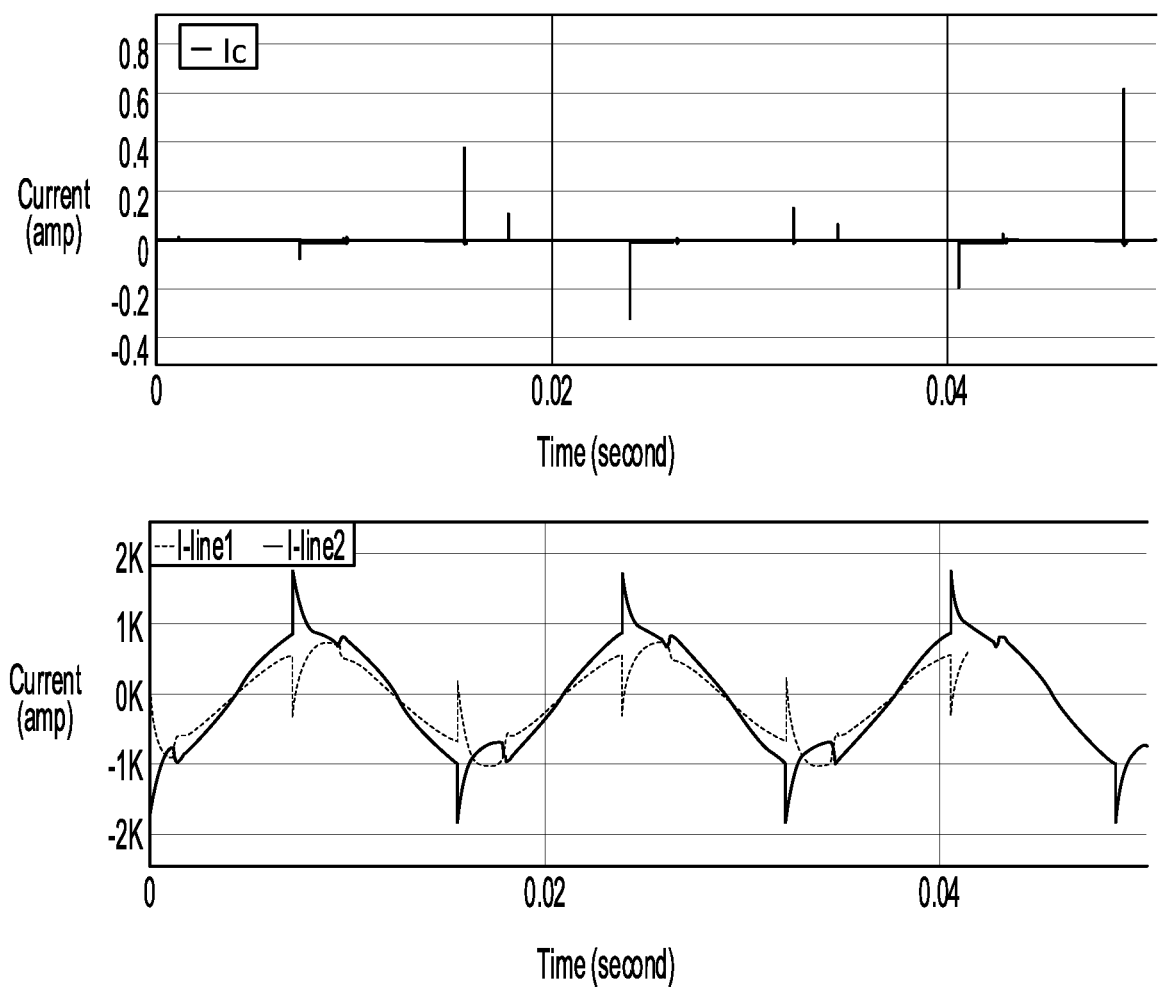
FIG. 3 illustrates example current spikes in an inter-capacitor current sensor.

FIG. 3 illustrates example current spikes in an inter-capacitor current sensor. Referring to FIG. 3, the top half shows the current value of the inter-capacitor current sensor (e.g., inter-capacitor current sensor $CS_1$ of FIG. 2) for about 3 cycles in a 60 Hz power grid. The current value Ic represents current on the installed sensor, for example, inter-capacitor current sensor $CS_1$ between capacitors $C_1$ and $C_2$ of the power assembly units 201-202 as shown in FIG. 2. The bottom half of FIG. 3 represents the corresponding line current values, that is, I-line1 and I-line2, similar to those I1 and I2 shown in FIG. 4, as described in more detail herein below. That is used to confirm and interpret the current spikes.

Figure 4:
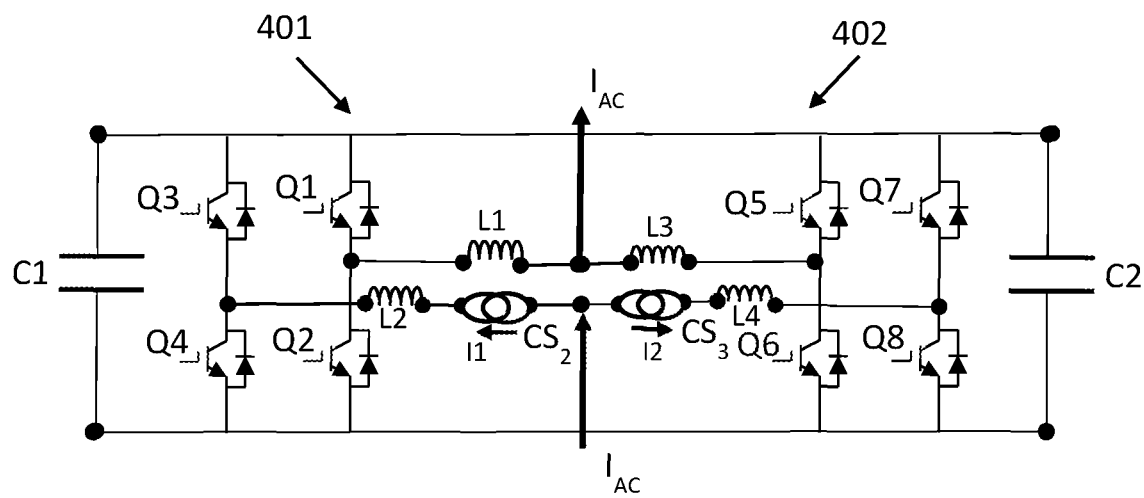
FIG. 4 illustrates an example line current sensor for each power assembly in parallel construction design according to one embodiment.

Referring now to FIG. 4, which illustrates an example line current sensor for each power assembly in parallel construction design according to one embodiment, a line current sensor is installed in each power assembly unit 401/402. They are labeled $CS_2$ and $CS_3$ respectively. These sensors $CS_2$ and $CS_3$ may be used to compute a capacitance value of coupling capacitors C1 and C2. Note that the current sensor is installed in each power assembly unit and is in series with the load. The current sensors $CS_2$ and $CS_3$ may detect non-uniform degradation between the capacitors C1 and C2. The capacitance value can be computed as a ratio of an integrated current over time divided by a capacitor voltage. Thus, imbalance between line currents I1 and I2 means that the capacitance values are different.

The imbalance between capacitance values of capacitors C1 and C2 may indicate non-uniform aging and degradation of capacitors C1 and C2. Since the capacitance value has its original baseline reference value, it may permit condition-based reconfiguration for the impedance injection module. As previously described, the imbalance between capacitance values of capacitors C1 and C2 may be due to the difference in switching delays between the power assembly units 401-402 (i.e., IGBTs Q1-Q8) that charge the capacitors C1 and C2, respectively, with different timings. In some embodiments, each of the capacitance values of capacitors C1 and C2 may drift from a baseline capacitance value due to a temperature rise that causes local melting or delamination, particularly with high ripple component that creates a strong force between capacitor electrodes of capacitor C1 and/or capacitor C2. The capacitance values of the capacitors C1 and C2 may drift independently from one another. In some embodiment, the drifting of the capacitors C1 and C2 is indicative of aging and degradation, which can be utilized to perform proactive maintenance scheduling and condition-based reconfiguration. The difference between the drifts (i.e., drift of capacitor C1 and drift of capacitor C2) can be a reason for current spikes detected by an inter-capacitor current sensor (e.g., inter-capacitor current sensor $CS_1$ of FIG. 2), although the spike may be caused by the difference in switching delays between the two power assemblies of their aging IGBTs (e.g., IGBTs Q1-Q8) and supporting components.

In some embodiments, the embodiments of FIG. 2 and FIG. 4 (i.e., power assembly units 201-202 and power assembly units 401-402) can be combined into one embodiment, though they are presented separately herein for clarity.

In various embodiments, this continuous monitoring with the use of current sensors can detect non-uniform aging and degradation of key components in the power assembly units. It can provide guidance for proactive condition-based maintenance scheduling. The quantification of the capacitance value can also permit condition-based reconfiguration. The impedance injection module can be reconfigured to support lower injection level based on, for example, the new-found capacitance value.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. A system to detect non-uniform aging and degradation of power assembly units, comprising:
   a first power assembly unit and a second power assembly unit adjacent to the first power assembly unit, each of the first and second power assembly units having a coupling capacitor; and
   first and second line current sensors in the first and second power assembly units, respectively, to detect a difference between a first capacitance value of the coupling capacitor of the first power assembly unit and a second capacitance value of the coupling capacitor of the second power assembly unit.

2. The system of claim 1, wherein to detect the difference between the first and second capacitance values, the first line current sensor in the first power assembly unit is used to compute the first capacitance value and the second line current sensor in the second power assembly unit used to compute the second capacitance value.

3. The system of claim 1, wherein the difference between the first and second capacitance values is detected when there is an imbalance between respective line currents passing through the first and second line current sensors.

4. The system of claim 1, wherein the first and second line current sensors are connected in series to measure a line current.

5. The system of claim 1, wherein the difference between the first and second capacitance values is caused by a temperature rise that results in local melting or delamination.

6. The system of claim 1, wherein the first power assembly unit and the second power assembly unit are arranged in mirror image.

7. The system of claim 1, wherein the first and second power assembly units are impedance injection modules.

* * * * *